United States Patent
Hsu et al.

(10) Patent No.: US 12,140,618 B2
(45) Date of Patent: Nov. 12, 2024

(54) PROBE CLEANING SHEET FOR PREVENTING A PROBE PIN DAMAGE AND MANUFACTURING METHOD THEREOF

(71) Applicant: CKT TEK CO., LTD., New Taipei (TW)

(72) Inventors: Li-Wen Hsu, New Taipei (TW); Chun-Liang Chen, New Taipei (TW); Chih-Tang Lee, New Taipei (TW)

(73) Assignee: CKT TEK CO., LTD., New Taipei (TW)

( * ) Notice: Subject to any disclaimer, the term of this patent is extended or adjusted under 35 U.S.C. 154(b) by 163 days.

(21) Appl. No.: 18/071,839

(22) Filed: Nov. 30, 2022

(65) Prior Publication Data

US 2023/0168283 A1   Jun. 1, 2023

(30) Foreign Application Priority Data

Dec. 1, 2021  (TW) ................................ 110144839

(51) Int. Cl.
*G01R 3/00* (2006.01)
*B24D 11/00* (2006.01)
*H01L 21/67* (2006.01)

(52) U.S. Cl.
CPC .............. *G01R 3/00* (2013.01); *B24D 11/001* (2013.01); *H01L 21/67028* (2013.01)

(58) Field of Classification Search
CPC .... G01R 3/00; B24D 11/001; H01L 21/67028
See application file for complete search history.

(56) References Cited

U.S. PATENT DOCUMENTS

| | | | | |
|---|---|---|---|---|
| 2004/0182418 A1* | 9/2004 | Yoshida | ................ | B08B 7/0014 15/210.1 |
| 2008/0193728 A1* | 8/2008 | Yoshida | .................... | C09J 7/29 428/354 |
| 2008/0242576 A1* | 10/2008 | Tamura | .................. | C11D 3/373 510/179 |
| 2010/0134235 A1* | 6/2010 | Yoshioka | ............. | H01C 7/1006 338/21 |
| 2012/0280706 A1* | 11/2012 | Uenda | ..................... | B08B 1/143 15/209.1 |

FOREIGN PATENT DOCUMENTS

| | | |
|---|---|---|
| JP | H11238768 A | 8/1998 |
| JP | 3072423 U | 10/2000 |

* cited by examiner

*Primary Examiner* — Alvaro E Fortich
(74) *Attorney, Agent, or Firm* — MUNCY, GEISSLER, OLDS & LOWE, P.C.

(57) ABSTRACT

A probe cleaning sheet for preventing a probe pin damage and manufacturing method thereof, during the process of a probe pin puncturing the cleaning layer, the material of the cleaning layer and the plurality of high and low density cleaning particles of abrasive material contained in the high density cleaning material and the low density cleaning material are able to efficiently scrape away foreign material from the surface of the probe pin. In addition, the negative charge carried by the silicone itself and its lipophilic characteristics are used to transfer the foreign material on the probe pin to the cleaning layer, and the protective layer is used to prevent overpressure from the probe pin directly impacting the substrate and causing damage to the tips of the probe pin.

12 Claims, 3 Drawing Sheets

PROBE CLEANING SHEET FOR PREVENTING A PROBE PIN DAMAGE AND MANUFACTURING METHOD THEREOF

BACKGROUND OF THE INVENTION

(a) Field of the Invention

The present invention relates to a probe cleaning sheet for preventing a probe pin damage and manufacturing method thereof, and more particularly to a probe cleaning sheet and manufacturing method thereof.

(b) Description of the Prior Art

The testing of electronic components (such as: final test (FT) or chip probing (CP), but not limited to such), requires the use of a probe pin to carry out electrical measurements; however, any foreign substances or scratches on the probe pin will possibly affect the test results of the electronic components.

The method of removing foreign substances using the tips of the probe pin head to pierce through a cleaning component, such as acrylic resin or urethane resin, is known in the prior art; however, there are shortcomings of such a method, including fragments on the cleaning component forming new foreign substances that adhere to the tips of the probe pin, or damage being caused to the tips of the probe pin when puncturing, which frequently results in excessive wear on the tips of the probe pin or the inability to clean.

In order to resolve the above-described problems, probe card cleaning sheets have been developed for cleaning that are currently selling on the market (with a product name "MIPOX", manufactured by Nihon Micro Coating Co., Ltd.). The probe card cleaning sheets are structurally provided with a polyurethane substrate, which have good buffer performance. One surface of the substrate has a polishing layer containing finer abrasive powder, and a binder layer is on the other surface, which enables the cleaning sheet to bind to the substrate; for example: for use on a silicon wafer. More specifically, when the cleaning sheet is attached to the substrate with the same shape and dimensions appropriate for that provided with a semiconductor wafer, the probe pin and the polishing layer surface of the cleaning sheet are used to remove foreign substances by applying pressure contact.

As for cleaning sheets for use to remove foreign material adhering to probe pin tips, the Japanese Patent Publication No. 3072423 and Japanese Patent Publication No. 11-238768 have made public cleaning sheets for cleaning probe pin tips, comprising: a cleaning film, the surface of which is fixed with a finer abrasive powder, an elastic sheet mounted on the lower side of the cleaning film, and a substrate mounted on the lower side of the elastic sheet. The structures of the cleaning sheets for cleaning probe pin tips of the above patents further disclose substituting the finer abrasive powder fixed to the surface of a cleaning film with a hard metallic film for cleaning use, wherein the hard metallic film causes the surface to become rough. The material for the elastic cleaning sheet includes silicone rubber and urethane rubber.

However, the probe cleaning sheets of the prior art cannot be used at room temperature or in a hot environment, or in a low temperature environment; moreover, they cannot be used to inspect buffered semiconductors, and are unable to gently and efficiently clean front ends of a probe pin.

Hence, it can be seen that many shortcomings still exist in the above-described products of the prior, and in reality are not good designs, and thus in need of urgent improvement.

SUMMARY OF THE INVENTION

In light of the above, the inventor of the present invention, having accumulated many years of experience in manufacturing development and design of related products, in accordance with the above-described objects, added additional details to the design followed by careful evaluation, and finally achieved the present invention with true practicability.

The object of the present invention lies in providing a probe cleaning sheet for preventing a probe pin damage and manufacturing method thereof, which is used to remove foreign material adhering to the tips and side edges of a probe pin through contact with a cleaning layer, to achieve a cleaning effect. The probe cleaning sheet can not only be used at room temperature or in a hot environment, but also in a low temperature environment, thereby enabling performing sufficient inspection of buffered semiconductors as well as gentle and efficient cleaning of the front ends of the probe.

According to the above-described object, a probe cleaning sheet for preventing a probe pin damage and manufacturing method thereof of the present invention mainly comprises: a mold release layer, a cleaning layer, a protective layer, and a substrate. The mold release layer is positioned on one side of the cleaning layer and can be a mold release film attached to one side of the cleaning layer or a silicone coating coated on one side of the cleaning layer. The protective layer is positioned on the other side of the cleaning layer and is a layer of netting. The substrate is positioned on the other side of the protective layer relative to the cleaning layer. The cleaning layer is composed of a high density cleaning material and a low density cleaning material. The high density cleaning material is made up from a plurality of high density cleaning particles, and the low density cleaning material is made up from a plurality of low density cleaning particles. The cleaning layer is a silicone material, which is formed as an integral body with the cleaning material on the substrate; or, after forming the cleaning layer, an adhesion method is used to bond it to the substrate. Accordingly, during the process of the probe pin puncturing the cleaning layer, the material of the cleaning layer and the plurality of high and low density cleaning particles of abrasive material contained in the high density cleaning material and the low density cleaning material are able to efficiently scrape away foreign material from the surface of the probe pin. In addition, the negative charge carried by the silicone itself and its lipophilic characteristics are used to transfer the foreign material on the probe pin to the cleaning layer, and the protective layer is used to prevent overpressure from the probe pin directly impacting the substrate and causing damage to the tips of the probe pin.

In order for the review committee to further understand the objects, formation, structural configuration characteristics, and effectiveness of the present invention, the disclosed embodiments and accompanying drawings are described in detail below.

DETAILED DESCRIPTION OF THE PREFERRED EMBODIMENTS

Figure 1:
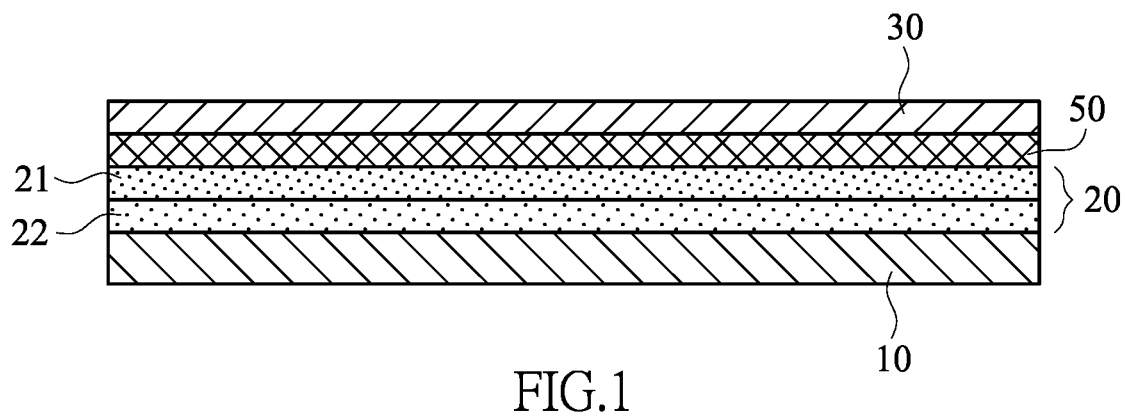
FIG. 1 is a cross-sectional schematic view of a probe cleaning sheet for preventing a probe pin damage and manufacturing method thereof of the present invention.
Figure 2:
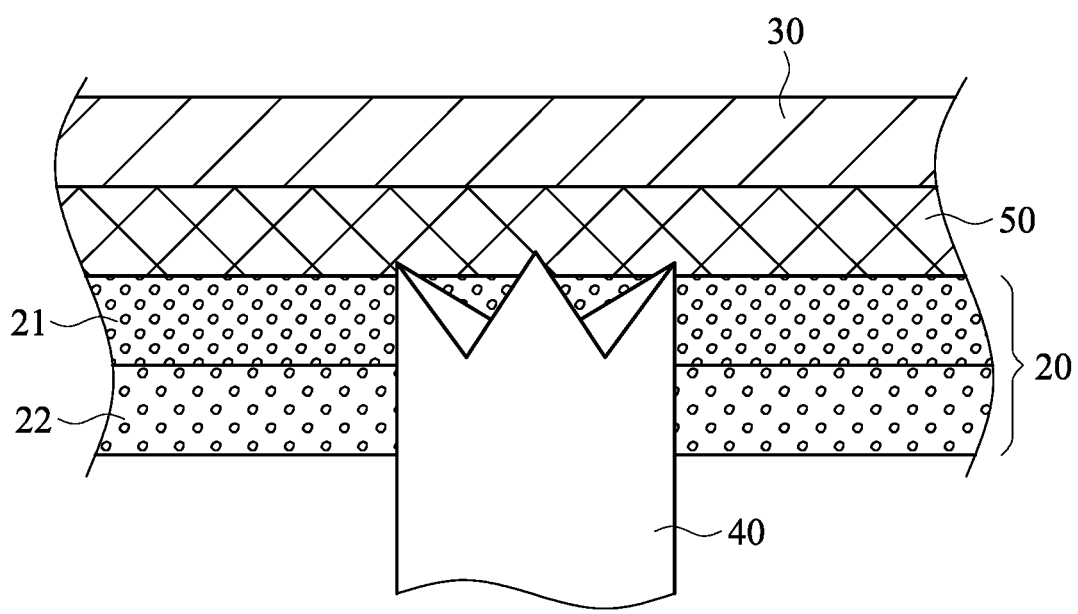
FIGS. 2 and 3 are successive application schematic views of the probe cleaning sheet for preventing a probe pin damage and manufacturing method thereof according to the present invention.
Figure 3:
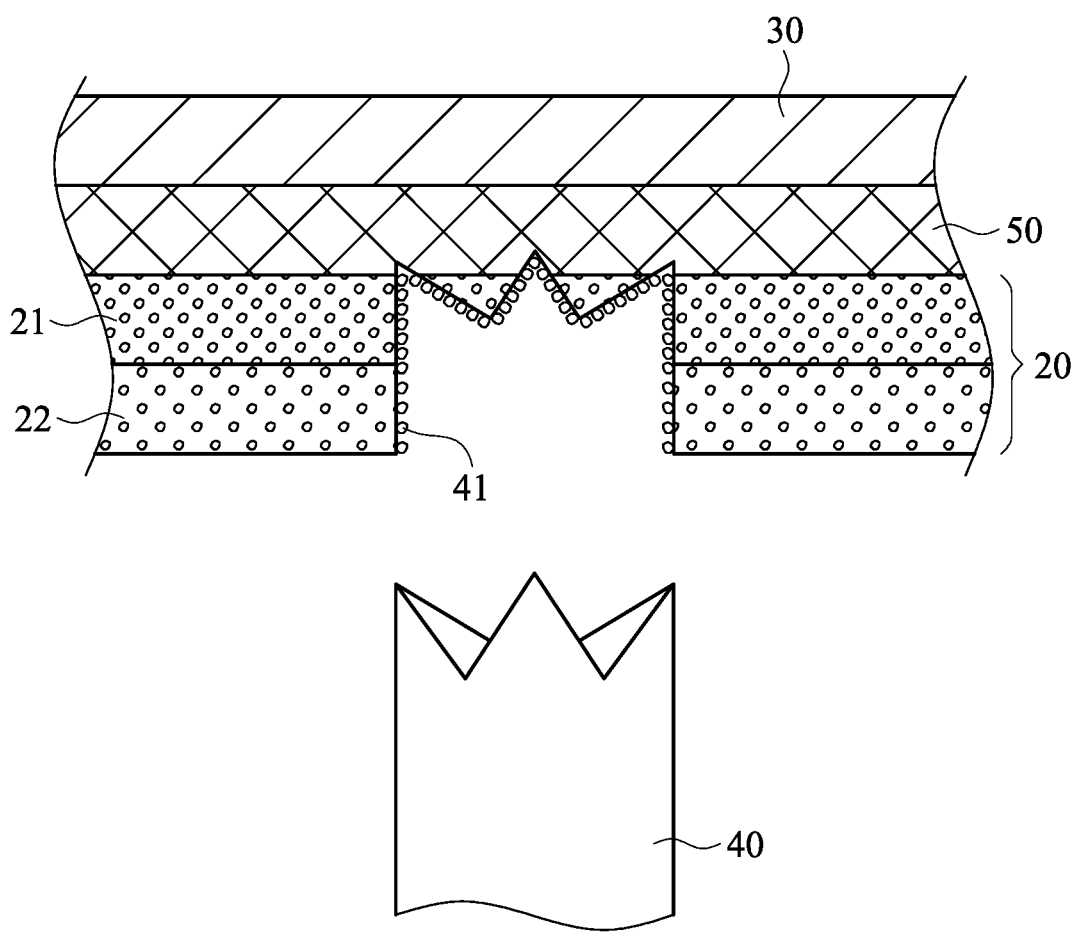

The present invention relates to a "probe cleaning sheet for preventing a probe pin damage and manufacturing method thereof", and FIGS. 1, 2, and 3, show the probe cleaning sheet for preventing a probe pin damage and manufacturing method thereof, wherein the probe cleaning sheet mainly comprises: a mold release layer 10, a cleaning layer 20, a protective layer 50, and a substrate 30.

The mold release layer 10 is positioned on one side of the cleaning layer 20. The mold release layer 10 can be a mold release film attached to one side of the cleaning layer 20 or a silicone coating coated on one side of the cleaning layer 20, and is mainly used to protect the surface of a product during shipment.

The protective layer 50 is positioned on the other side of the cleaning layer 20, with the protective layer 50 being a layer of netting.

The substrate 30 is positioned on the other side of the protective layer 50 relative to the cleaning layer 20.

The cleaning layer 20 is composed of a high density cleaning material 21 and a low density cleaning material 22. The high density cleaning material 21 is made up from a plurality of high density cleaning particles, and the low density cleaning material is made up from a plurality of low density cleaning particles. The cleaning layer 20 is a silicone (silicone resin) material, and is formed as an integral body with the cleaning materials on the substrate 30, thereby saving on adhesion time for clients, and under high temperature conditions prevents problems of the adhesion layer producing air bubbles and separation. Or, after forming the cleaning layer, an adhesion method can be used to bond it to the substrate 30.

According to the assembly of the above-described components, during the process of a probe pin 40 puncturing the cleaning layer 20, the material of the cleaning layer 20 and the plurality of high and low density cleaning particles of abrasive material contained in the high density cleaning material 21 and the low density cleaning material 22 are able to efficiently scrape away foreign material 41 from the surface of the probe pin 40. In addition, the negative charge carried by the silicone itself and its lipophilic characteristics are used to transfer the foreign material 41 on the probe pin 40 to the cleaning layer 20, and the protective layer 50 is used to prevent overpressure from the probe pin 40 directly impacting the substrate 30 and causing damage to the tips of the probe pin 40.

Referring to FIGS. 1, 2, and 3, the substrate 30 can be a glass fiber sheet, a plastic sheet, a lead free stone sheet, or a metal sheet.

Referring again to FIGS. 1, 2, and 3, the plurality of cleaning particles of abrasive material contained in the high density cleaning material 21 and the low density cleaning material 22 undergo surface treatment, which is used to increase the cross-linking force between the abrasive material and the silicone, thereby preventing the abrasive material from stripping away and falling off during the cleaning process.

Referring again to FIGS. 1, 2, and 3, the abrasive material used for the plurality of cleaning particles contained in the high density cleaning material 21 and the low density cleaning material 22 is finer abrasive powder with a particle diameter of 2 µm to 5 µm. Further, the cleaning particles can be spherical α-alumina powder with an average particle diameter of 2~5 µm, requiring hydrophilic silicone surface treatment, wherein, because of the sharp angle exterior of the sheet form or irregular shaped abrasive powder, the spherical structure prevents damage to the surface of the probe pin 40 from occurring. Small particle diameters are selected, because large particle diameters would result in damaging or scratching the probe pin 40. Furthermore, different friction surface texturing of abrasive paper with the same thickness will have dissimilar effects on the probe pin 40.

Referring again to FIGS. 1, 2, and 3, the material used for the plurality of cleaning particles of abrasive material contained in the high density cleaning material 21 and the low density cleaning material 22 can be made up from aluminum oxide, silicon nitride, boron nitride, silicon carbide, boron carbide, or diamonds, wherein there is at least one of type of inorganic fine powder.

Referring again to FIGS. 1, 2, and 3, the plurality of cleaning particles of abrasive material contained in the high density cleaning material 21 and the low density cleaning material 22 are made up from spherical α-alumina powder with an average particle diameter of 2~5 µm, requiring hydrophilic silicone surface treatment, wherein, because of the sharp angle exterior of the sheet form or irregular shaped abrasive powder, the spherical structure prevents damage to the surface of the probe pin 40 from occurring. Small particle diameters are selected, because large particle diameters would result in damaging or scratching the probe pin 40. Furthermore, different friction surface texturing of abrasive paper with the same thickness will have dissimilar effects on the probe pin 40.

Referring again to FIGS. 1, 2, and 3, the silicone resin material of the cleaning layer 20 can be selected from an epoxy resin, an urethane resin, or an acrylic resin.

Referring again to FIGS. 1, 2, and 3, the silicone material of the cleaning layer 20 can be an all-purpose type, a long life type, a high strength type, a mixture of an all-purpose and a long life type, or a mixture of an all-purpose type, a long life type, and a high strength type. Different types of silicone have different degrees of tolerance to puncturing by the probe pin 40 as well as degrees of covering, and thus requires the use of different material characteristics and adopting a combination design that does not use a single material.

Referring again to FIGS. 1, 2, and 3, the silicone material of the cleaning layer 20 is a mixture of an all-purpose type and a long life type in the ratio of 0:1 to 1:1, respectively, with a preferred ratio of 1:1. Using such a ratio enables achieving a balance between cost and cleaning frequency. The ratio of the long life type added must be increased if the weight of the added fine abrasive powder exceeds the silicone by 3-fold.

Referring again to FIGS. 1, 2, and 3, to improve cleaning efficiency, the ratio of silicone to the plurality of cleaning particles of the abrasive material contained in the high density cleaning material 21 in the cleaning layer 20 can be 1:2~1:4.

Referring again to FIGS. 1, 2, and 3, to improve cleaning efficiency, the ratio of silicone to the plurality of cleaning particles of the abrasive material contained in the low density cleaning material 22 in the cleaning layer 20 can be 1:1.5~1:2.

Referring again to FIGS. 1, 2, and 3, the mold release film of the mold release layer 10 attached to one side of the cleaning layer 20 can be a paper base material, such as high quality paper; cellophane; a paper base material coated with a mold release, such as silicone; polyethylene laminated paper, a polyethylene film, or a polypropylene film.

Referring again to FIGS. 1, 2, and 3, when using the present invention in a 150~200° C. environment, adopting an adhesion method to attach the cleaning layer 20 to the substrate 30 easily causes air bubbles to form in the adhesive layer or displacement thereof because of the high temperature, with the formation of air bubbles resulting in an uneven surface on the cleaning sheet. Hence, an one-piece molding method is adopted that directly molds the cleaning layer 20 on the substrate 30, thereby resolving the problems resulting from using an adhesion method.

Principles behind the invention: because silicone can be punctured, the silicone containing abrasive material will coat the probe pin 40 with the foreign material 41 when puncturing the silicone surface, and friction between the two is used to separate the foreign material 41 from the surface of the probe pin 40. The frictional force derives from the composite body of the silicone and the abrasive materials, and the negative charge carried by the silicone itself together with its lipophilic characteristics are used to transfer the foreign material 41 or oil stains to the contact surface between the silicone surface and the probe pin 40. Moreover, because the abrasive materials filled inside the silicone elastic body applies an abrasive force directly on the probe pin 40, thus, the filling ratio of the abrasive material is relied upon to control the abrasive force. The silicone hardness and abrasive force will increase if the filling ratio is high, however, there is the risk of it resulting in wearing away of the tips of the probe pin 40 and powdering, and, contrary to expectations, will bring about an inadequate cleaning force.

Referring again to FIGS. 1, 2, and 3, the principles behind using a mixture of different types of silicone are:
1. to adjust the puncture resistance force of the probe pin 40;
2. to increase the restoring force after puncturing the silicone, whereby when the restoring force is increased, the same position can be punctured a number of times, which reduces costs for the client compared to other products that require shifting the position after each puncturing.

Referring again to FIGS. 1, 2, and 3, the netting of the protective layer 50 can be a carbon fiber netting, a glass fiber netting, or an air-permeable cloth.

Figure 4:
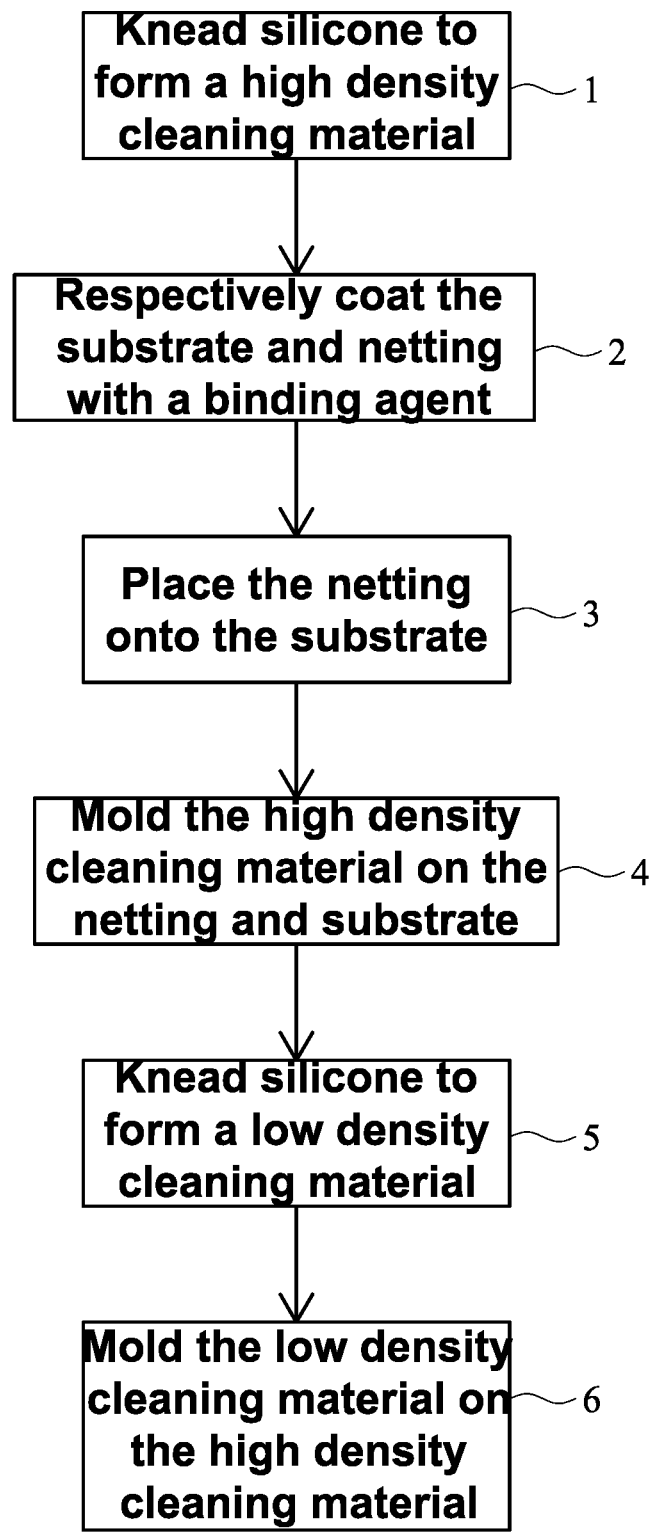
FIG. 4 is a block schematic view depicting the manufacturing method of the probe cleaning sheet for preventing a probe pin damage according to the present invention.

Referring to FIGS. 1 and 4, which show the probe cleaning sheet for preventing a probe pin damage and manufacturing method thereof of the present invention, wherein the manufacturing method of the probe cleaning sheet comprises:
1. kneading the silicone and high density abrasive fine powder using a special machine to form a kneaded silicone, and in order to form the high density cleaning material 21 with a high filling ratio, because an increase in shearing force results in a temperature rise, an applicable cooling equipment is required to prevent the silicone from undergoing an early reaction because of the high temperature, resulting in dead material;
2. respectively coating the surfaces of the substrate 30 and the netting of the protective layer 50 with a binding agent (thickness: 0.01~0.03 mm), and heating at a temperature of 90° C. for 10 minutes to cause hardening of the binding agent;
3. placing the netting of the protective layer 50 onto the substrate 30;
4. placing the kneaded silicone cut to appropriate dimensions onto the substrate 30 and the netting of the protective layer 50, and then placing this configuration into a mold, molding the high density cleaning material 21 on the substrate 30 and the protective layer 50 to form a single body,
5. kneading the silicone and a low density abrasive fine powder using a special machine to form a kneaded silicone, and in order to form the low density cleaning material 22 with a high filling ratio, because an increase in shearing force results in a temperature rise, an applicable cooling equipment is required to prevent the silicone from undergoing an early reaction because of the high temperature, resulting in dead material;
6. placing the kneaded silicone cut to appropriate dimensions onto the high density cleaning material 21, and then placing this configuration into a mold, molding the low density cleaning material 22 on the high density cleaning material 21 to form a single body.

The probe cleaning sheet for preventing a probe pin damage and manufacturing method thereof provided by the present invention, is provided with the following advantages when compared to the above-described prior art:
1. the majority of cleaning sheets currently commercially available mainly comprise an abrasive material added into a macromolecular polymeric material, which requires an increase in the addition of abrasive material in order to increase the cleaning effect; however. increasing the amount of filler (abrasive material) in the macromolecular polymeric material causes intermolecular cohesion to decrease accordingly. Hence, when the probe pin 40 is repeatedly puncturing at the same position, problems of flaking will result because of molecular scission. However, because silicone itself has the characteristics of carrying a negative charge, lipophilicity, elasticity, and compressibility, but has puncture intolerability, therefore these characteristics are used as the basis for the present invention, and is how the probe pin 40 can puncture the cleaning layer 20 and then transfer the foreign material 41 on the surface of the probe pin 40 to the silicone;
2. uses double layer and one-piece molding to improve the cleaning effect of the tips of the probe pin 40 compared to a single layer structure. A general single layer structure cannot be filled with excessively high density abrasive powder because dense packing frequently results in powdering occurring when puncturing, and thus requires relying on repeated puncturing to achieve a cleaning effect of the tips of the probe pin. Hence, a composite structure is what is needed to improve such problems;
3. no problems of air bubbles forming in the adhesive layer or displacement thereof under a high temperature of 180° C.;
4. no powdering occurs during the cleaning process; moreover, the cleaning effect of the probe pin 40 does not result in scratching thereof;
5. adopts a double layer structure to strengthen the cleaning effect of the tips of the probe pin 40, and the ratio of abrasive particles in the low density cleaning layer is reduced, the main objective of which lies in first carrying out a preliminary cleaning, and because of the reduction in the filling ratio of abrasive particles, there is good restorability after being subjected to puncturing by the probe pin 40. Another object lies in the adhesion method using an integral molding method between the high and low density cleaning layers 21, 22, whereby, after puncturing the high density cleaning layer 21, any possibility of stripping away is counteracted by the preventive measure of the low density cleaning to layer 22. Further, the high density cleaning layer 21 uses a densely packed abrasive powder to strengthen the cleaning effect of the tips of the probe pin 40, and also adopts a double layer structure and an integral molding method, thereby improving upon the cleaning effect of the tips of the probe pin 40 compared to general single layer structures. A general single layer structure cannot be filled with excessively high density abrasive powder because dense packing frequently results in powdering occurring when puncturing, and thus requires relying on repeated puncturing for the tips of the probe to achieve a cleaning effect. Hence, a composite structure is what is needed to improve such problems;

6. prevents the probe pin 40 from directly impacting the metal substrate 30 and causing damage to the tips during the cleaning process because of excessive pressure from the probe pin 40; moreover, the structural strength of the high density cleaning layer is reinforced.

In conclusion, the probe cleaning sheet for preventing a probe pin damage and manufacturing method thereof of the present invention is assuredly provided with a hitherto unknown innovative structure not found in the prior art. Moreover, no similar products have been seen in any publication or in the market; the present invention is thus provided with undoubted originality. In addition, the present invention is provided with unique characteristics and functionality that are without comparison in the prior art. Hence, the incomparable advancement of the present invention clearly complies with the essential elements as required for a new patent application. Accordingly, a new patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A probe cleaning sheet for preventing a probe pin damage comprising:
   a cleaning layer, the cleaning layer is composed of a high density cleaning material and a low density cleaning material, wherein the high density cleaning material is made up from a plurality of high density cleaning particles, and the low density cleaning material is made up from a plurality of low density cleaning particles, the cleaning layer is a silicone material;
   a mold release layer, the mold release layer is positioned on one side of the cleaning layer, and is a mold release film attached to one side of the cleaning layer or is a silicone coating coated on one side of the cleaning layer;
   a protective layer, the protective layer is positioned on the other side of the cleaning layer, the protective layer is a layer of netting; and
   a substrate, the substrate is positioned on the other side of the protective layer relative to the cleaning layer; the cleaning layer is formed as an integral body with the cleaning layer on the substrate, or, after forming the cleaning layer,
   by using the probe pin puncturing the cleaning layer, the material of the cleaning layer and the plurality of high and low density cleaning particles of abrasive material contained in the high density cleaning material and the low density cleaning material are able to efficiently scrape away foreign material from the surface of the probe pin; a negative charge carried by the silicone along with lipophilic characteristics thereof are used to transfer s foreign material on the probe pin to the cleaning layer, and the protective layer is used to prevent overpressure from the probe pin from directly impacting the substrate and causing damage to the tips of the probe pin.

2. The probe cleaning sheet for preventing a probe pin damage according to claim 1, wherein the substrate is selected from a glass fiber sheet, a plastic sheet, a lead free stone sheet, or a metal sheet.

3. The probe cleaning sheet for preventing a probe pin damage according to claim 1, wherein the plurality of cleaning particles of abrasive material contained in the high density cleaning material and the low density cleaning material undergo surface treatment.

4. The probe cleaning sheet for preventing a probe pin damage according to claim 3, wherein the abrasive material used for the plurality of cleaning particles contained in the high density cleaning material and the low density cleaning material is finer abrasive powder with a particle diameter of 2 μm to 5 μm.

5. The probe cleaning sheet for preventing a probe pin damage according to claim 4, wherein the material used for the plurality of cleaning particles of abrasive material contained in the high density cleaning material and the low density cleaning material is made up from aluminum oxide, silicon nitride, boron nitride, silicon carbide, boron carbide, or diamonds, wherein at least one of type of inorganic fine powder.

6. The probe cleaning sheet for preventing a probe pin damage according to claim 1, wherein the silicone material of the cleaning layer is selected from an epoxy resin, an urethane resin, and an acrylic resin.

7. The probe cleaning sheet for preventing a probe pin damage according to claim 6, wherein the silicone material of the cleaning layer is selected from an all-purpose type, a long life type, a high strength type, a mixture of an all-purpose and a long life type, or a mixture of an all-purpose type, a long life type, and a high strength type.

8. The probe cleaning sheet for preventing a probe pin damage according to claim 7, wherein the silicone material of the cleaning layer is a mixture of an all-purpose type and a long life type in the ratio of 0:1 to 1:1, respectively.

9. The probe cleaning sheet for preventing a probe pin damage according to claim 1, wherein the ratio of the silicone to the plurality of cleaning particles of the abrasive material contained in the high density cleaning material in the cleaning layer is 1:2~1:4.

10. The probe cleaning sheet for preventing a probe pin damage according to claim 1, wherein the ratio of the silicone to the plurality of cleaning particles of the abrasive material contained in the low density cleaning material in the cleaning layer is 1:1.5~1:2.

11. The probe cleaning sheet for preventing a probe pin damage according to claim 1, wherein a netting of the protective layer is selected from a carbon fiber netting, a glass fiber netting, and an air-permeable cloth.

12. A probe cleaning sheet for preventing a probe pin damage and manufacturing method thereof, wherein the manufacturing method of the probe cleaning sheet comprising steps of:
   a) kneading the silicone and high density abrasive fine powder using a special machine to form a kneaded silicone, and forming the high density cleaning material therewith;
   b) respectively coating the surfaces of the substrate and a netting of the protective layer with a binding agent (from 0.01~0.03 mm in thickness), and heating at a temperature of 90° C. for 10 minutes to cause hardening of the binding agent;
   c) placing the netting of the protective layer onto the substrate;
   d) placing the kneaded silicone cut to appropriate dimensions onto the substrate and the netting of the protective layer, and then placing this configuration into a mold, molding the high density cleaning material on the substrate and the protective layer to form a single body;
   e) kneading the silicone and a low density abrasive fine powder using a special machine to form a kneaded silicone, and forming the low density cleaning material therewith;
   f) placing the kneaded silicone cut to appropriate dimensions onto the high density cleaning material, and then placing this configuration into a mold, molding the low density cleaning material on the high density cleaning material to form a single body.

* * * * *